(12) United States Patent
Happ et al.

(10) Patent No.: US 7,626,858 B2
(45) Date of Patent: Dec. 1, 2009

(54) INTEGRATED CIRCUIT HAVING A PRECHARGING CIRCUIT

(75) Inventors: Thomas Happ, Tarrytown, NY (US); Jan Boris Philipp, Peekskill, NY (US); Ming-Hsiu Lee, Elmsford, NY (US)

(73) Assignees: Qimonda North America Corp., Cary, NC (US); Macronix International Co., Ltd., Hsin Chu (TW)

(*) Notice: Subject to any disclaimer, the term of this patent is extended or adjusted under 35 U.S.C. 154(b) by 292 days.

(21) Appl. No.: 11/450,605

(22) Filed: Jun. 9, 2006

(65) Prior Publication Data

US 2007/0285976 A1 Dec. 13, 2007

(51) Int. Cl.
G11C 11/00 (2006.01)
(52) U.S. Cl. .................. 365/163; 365/148; 365/158
(58) Field of Classification Search .......... 365/163, 365/148, 100
See application file for complete search history.

(56) References Cited

U.S. PATENT DOCUMENTS

| | | | |
|---|---|---|---|
| 6,075,719 A | 6/2000 | Lowrey et al. | |
| 6,687,153 B2 | 2/2004 | Lowrey | |
| 6,707,712 B2* | 3/2004 | Lowery | 365/175 |
| 6,759,267 B2 | 7/2004 | Chen | |
| 2004/0202017 A1* | 10/2004 | Lee | 365/163 |
| 2004/0228163 A1* | 11/2004 | Khouri et al. | 365/154 |
| 2004/0246804 A1 | 12/2004 | Cho et al. | |
| 2004/0246808 A1* | 12/2004 | Cho et al. | 365/230.06 |
| 2005/0117387 A1 | 6/2005 | Hwang et al. | |
| 2005/0117388 A1 | 6/2005 | Cho et al. | |
| 2005/0128791 A1* | 6/2005 | Kang | 365/154 |
| 2005/0128799 A1* | 6/2005 | Kurotsuchi et al. | 365/163 |
| 2005/0185444 A1* | 8/2005 | Yang et al. | 365/148 |
| 2008/0232161 A1* | 9/2008 | Choi et al. | 365/163 |

OTHER PUBLICATIONS

Bedeschi et al., F., "4Mb MOSFET-Selected Phase Change Memory Experimental Chip," ESSCIRC, 2004.
Lai, Stefan, "OUM-A 180 nm Nonvolatile Memory Cell Element Technology For Stand Along And Embedded Applications," IEDM, 2001, 4 pgs., (2004).
Ha, Y.H., "An Edge Contact Type Cell For Phase Change RAM Featuring Very Low Power Consumption," VLSI, 2003, 2 pgs., (2003).
Horii, H., "A Novel Cell Technology Using N-Doped GeSbTe Films For Phase Change RAM," VLSI, 2003, 2 pgs., (2003).

* cited by examiner

Primary Examiner—Vu A Le
Assistant Examiner—Han Yang
(74) Attorney, Agent, or Firm—Dicke, Billig & Czaja, PLLC

(57) ABSTRACT

A memory includes a phase change element having a first side and a second side and a first line coupled to the first side of the element. The memory includes an access device coupled to the second side of the element and a second line coupled to the access device for controlling the access device. The memory includes a circuit for precharging the first line to a first voltage and for applying a voltage pulse to the second line such that a current pulse is generated through the access device to the element to program the element to a selected one of more than two states. The voltage pulse has an amplitude based on the selected state.

22 Claims, 12 Drawing Sheets

INTEGRATED CIRCUIT HAVING A PRECHARGING CIRCUIT

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. Cells in such intermediate states have a resistance that lies between the fully crystalline state and the fully amorphous state. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

To program a phase change memory cell to an intermediate resistance value, the amount of crystalline material coexisting with amorphous material and hence the cell resistance is controlled via a suitable write strategy. The amount of crystalline material coexisting with amorphous material should be precisely controlled to ensure consistent resistance values for multi-bit storage. Consistent resistance values having a narrow distribution of the different resistance levels ensure that a sufficient sensing margin can be obtained.

For these and other reasons, there is a need for the present invention.

SUMMARY

One embodiment of the present invention provides a memory. The memory includes a phase change element having a first side and a second side and a first line coupled to the first side of the element. The memory includes an access device coupled to the second side of the element and a second line coupled to the access device for controlling the access device. The memory includes a circuit for precharging the first line to a first voltage and for applying a voltage pulse to the second line such that a current pulse is generated through the access device to the element to program the element to a selected one of more than two states. The voltage pulse has an amplitude based on the selected state.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
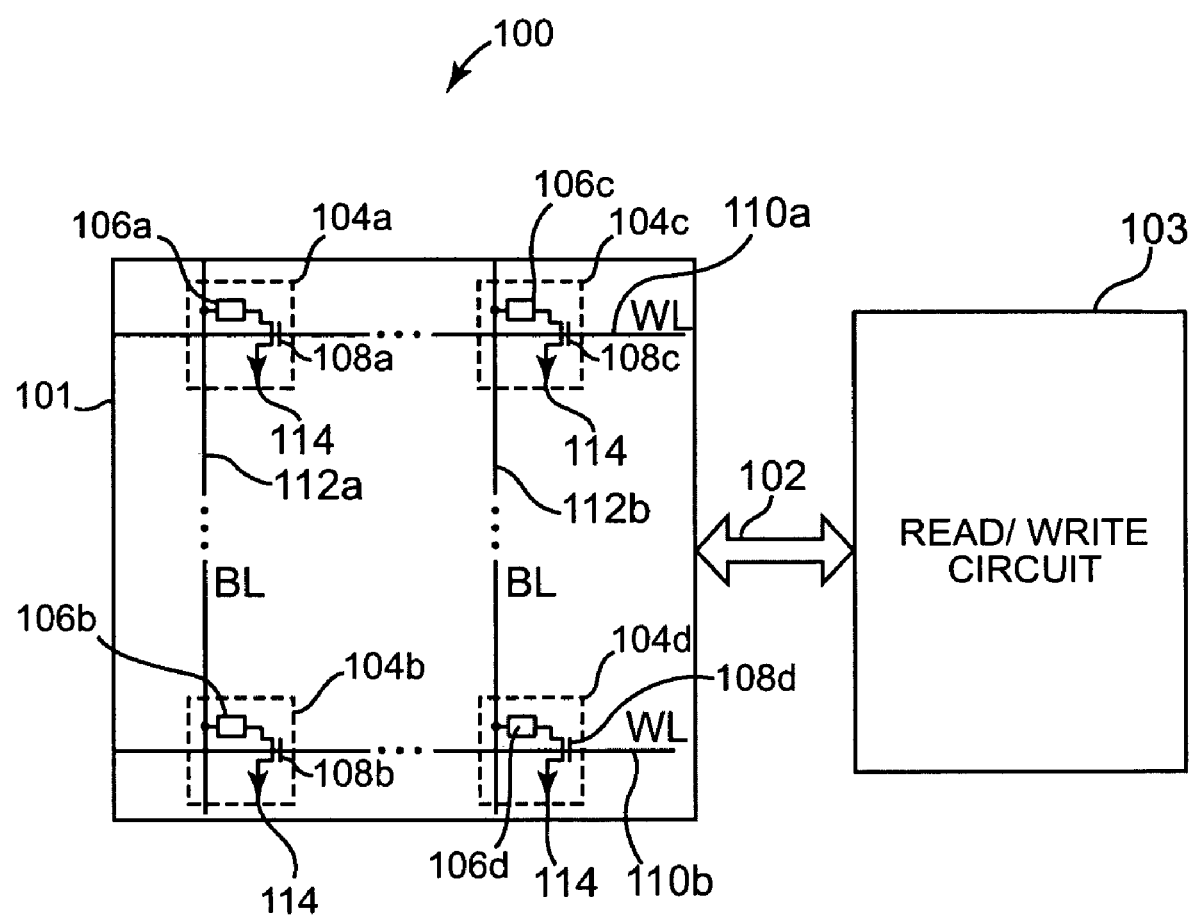
FIG. 1 is a diagram illustrating one embodiment of a memory device.

FIG. 1 is a diagram illustrating one embodiment of a memory device 100. Memory device 100 includes memory array 101 and read/write circuit 103. Memory array 101 is electrically coupled to read/write circuit 103 through signal path 102. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

A selected phase change memory cell 104 is programmed by first precharging the bit line 112 coupled to the selected memory cell 104 to a selected or fixed voltage. Next, a voltage pulse is provided on the word line 110 coupled to the selected memory cell 104 to program the selected memory cell 104. The bit line precharge voltage and the voltage pulse on the word line form a current through the selected memory cell 104 to program the selected memory cell to a desired resistance state. The selected memory cell 104 is programmed to the desired resistance state by controlling the amplitude of the voltage pulse provided on the word line 110. In one embodiment, the precharge voltage applied to the bit line is also adjusted based on the desired resistance state of the selected memory cell 104.

As used herein, the term "electrically coupled" is not meant to mean that the elements must be directly coupled together and intervening elements may be provided between the "electrically coupled" elements.

Each phase change memory cell 104 is electrically coupled to a word line 110, a bit line 112, and a common or ground 114. For example, phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Read/write circuit 103 provides signals to memory array 101 through signal path 102 to read data from and write data to memory cells 104. To program memory cells 104, read/write circuit 103 provides a precharge voltage on selected bit lines 112 and provides voltage pulses on selected word lines 110 to form current pulses through selected memory cells 104. The current pulses program one of the more than two resistance levels or states into the phase change material of each of the selected memory cells 104. Read/write circuit 103 senses the state of each memory cell 104 and provides signals that indicate the state of the resistance of each memory cell. Read/write circuit 103 reads each of the more than two states of memory cells 104.

During a set operation of phase change memory cell 104a, read/write circuit 103 precharges bit line 112a to a selected or fixed voltage. Next, read/write circuit 103 provides a voltage pulse on word line 110a thereby forming a current pulse through phase change element 106a using transistor 108a. The current pulse heats phase change element 106a above its crystallization temperature (but usually below its melting temperature). In this way, phase change element 106a reaches a crystalline state or a partially crystalline and partially amorphous state during this set operation. The amount of crystalline material coexisting with amorphous material, and hence the resistance of phase change element 106a is controlled by adjusting the amplitude of the voltage pulse provided on word line 110a. In another embodiment, the precharge voltage applied to bit line 112a is also adjusted based on the desired resistance state of phase change element 106a.

During a reset operation of phase change memory cell 104a, read/write circuit 103 precharges bit line 112a to a selected or fixed voltage. Next, read/write circuit 103 provides a voltage pulse on word line 110a thereby forming a current pulse through phase change element 106a using transistor 108a. The current pulse quickly heats phase change element 106a above its melting temperature. After the voltage pulse on word line 110a is turned off, phase change element 106a quickly quench cools into the amorphous state or a partially amorphous and partially crystalline state. The amount of amorphous material coexisting with crystalline material, and hence the resistance of phase change element 104a is controlled by adjusting the amplitude of the voltage pulse provided on word line 110a. In another embodiment, the precharge voltage applied to bit line 112a is also adjusted based on the desired resistance state of phase change element 104a. Phase change memory cells 104b-104d and other phase change memory cells 104 in memory array 101 are programmed similarly to phase change memory cell 104a using a similar current pulse formed in response to the bit line and word line voltages.

Figure 2:
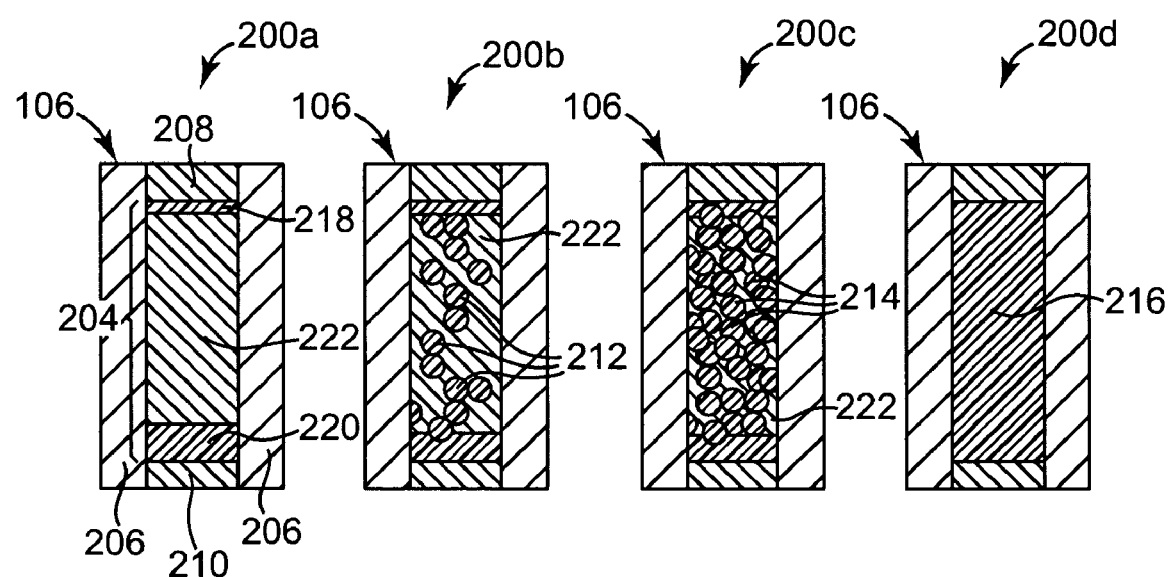
FIG. 2 is a diagram illustrating one embodiment of a phase change element in four different states.

FIG. 2 is a diagram illustrating one embodiment of a phase change element 106 in four different states at 200a, 200b, 200c, and 200d. Phase change element 106 includes a phase change material 204 that is laterally surrounded by insulation material 206. Phase change element 106 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 106 via first electrode 208 and second electrode 210. The current path through phase change material 204 is from one of the first electrode 208 and second electrode 210 to the other one of the first electrode 208 and second electrode 210. Phase change element 106 provides a storage location for storing bits of data.

Insulation material 206 can be any suitable insulator, such as $SiO_2$, fluorinated silica glass (FSG), or boro-phosphorous silicate glass (BPSG). First electrode 208 and second electrode 210 can be any suitable electrode material, such as TiN, TaN, W, Al, Ti, Ta, TiSiN, TaSiN, TiAlN, TaAlN, or Cu.

Phase change material 204 is programmed into one of four states to store two bits of data. A transistor 108 (FIG. 1) is coupled to first electrode 208 to control the application of pulses to phase change material 204. The pulses reset phase change material 204 and program one of the other three states into phase change material 204. At 200b, a small fraction 212 of phase change material 204 has been programmed to change the resistance through phase change material 204 and phase change element 106. At 200c, a medium sized fraction 214 of phase change material 204 has been programmed to change the resistance through phase change material 204 and phase change element 106. At 200d, a large fraction 216, which is substantially all of phase change material 204, has been programmed to change the resistance through phase change material 204 and phase change element 106.

The size of the programmed fraction is related to the resistance through phase change material 204 and phase change element 106. The three different phase change fractions at 200b-200d plus the initial state at 200a provide four states in phase change material 204, and phase change element 106 provides a storage location for storing two bits of data. In one embodiment, the state of phase change element 106 at 200a is a "00", the state of phase change element 106 at 200b is a "01", the state of phase change element 106 at 200c is a "10", and the state of phase change element 106 at 200d is a "11". In another embodiment, the state of phase change element 106 at 200a is a "11", the state of phase change element 106 at 200b is a "10", the state of phase change element 106 at 200c is a "01", and the state of phase change element 106 at 200d is a "00".

At 200a, phase change material 204 is reset to a substantially amorphous state. During a reset operation of phase change element 106, a reset current pulse is provided by a transistor 108 and sent through first electrode 208 and phase change material 204. The reset current pulse is formed in response to the precharge voltage on bit line 112 and the voltage pulse provided on word line 110 of transistor 108. The reset current pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a is the highest resistance state of phase change element 106.

To program phase change material 204 into one of the other three states 200b-200d, a set current pulse is provided by a transistor 108 and sent through first electrode 208 and phase change material 204. The set current pulse is formed in response to the precharge voltage on bit line 112 and the voltage pulse provided on word line 110 of transistor 108. At 200b, transistor 108 provides a set current pulse to program the small volume fraction 212 into a crystalline state. The crystalline state is less resistive than the amorphous state and phase change element 106 at 200b has a lower resistance than phase change element 106 in the substantially amorphous state at 200a. The partially crystalline and partially amorphous state at 200b is the second highest resistance state of phase change element 106.

At 200c, transistor 108 provides a set current pulse to program the medium volume fraction 214 into a crystalline state. Since the crystalline fraction 214 is larger than the crystalline fraction 212 and the crystalline state is less resistive than the amorphous state, phase change element 106 at 200c has a lower resistance than phase change element 106 at 200b and phase change element 106 in the amorphous state at 200a. The partially crystalline and partially amorphous state at 200c is the second lowest resistance state of phase change element 106.

At 200d, transistor 108 provides a set current pulse to program substantially all of the phase change material 216 into the crystalline state. Since the crystalline state is less resistive than the amorphous state, phase change element 106 at 200d has a lower resistance than phase change element 106 at 200c, phase change element 106 at 200b, and phase change element 106 in the amorphous state at 200a. The substantially crystalline state at 200d is the lowest resistance state of phase change element 106. In other embodiments, phase change element 106 can be programmed into any suitable number of resistance values or states. In other embodiments, phase change element 106 can be set to a substantially crystalline state and reset pulses can be used to program phase change element 106 to the desired resistance value or state.

Figure 3:
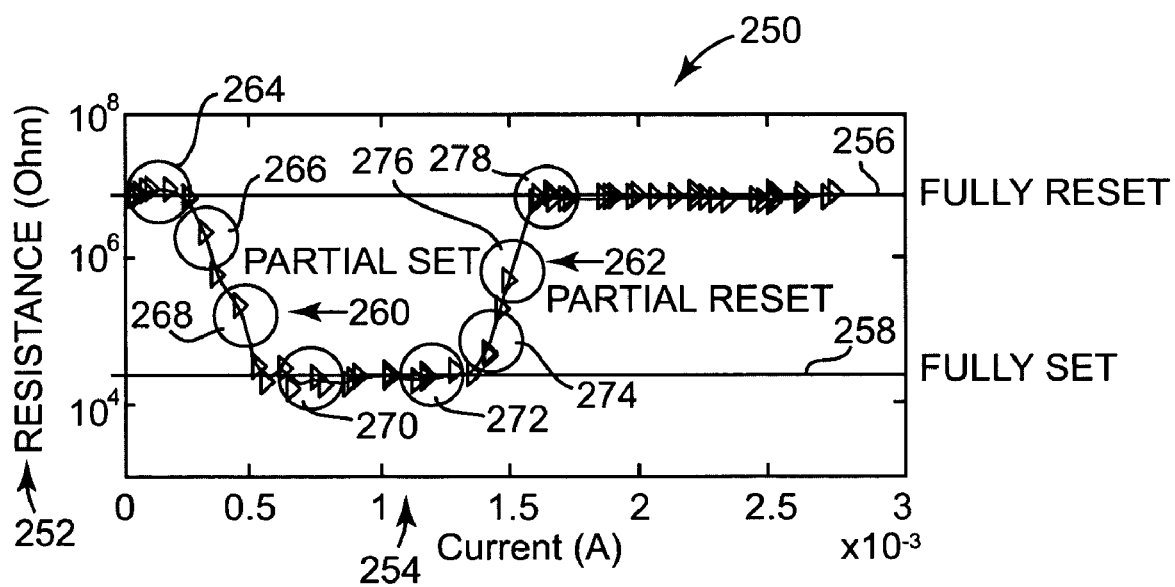
FIG. 3 is a graph illustrating one embodiment of setting the resistance states of a phase change element.

FIG. 3 is a graph 250 illustrating one embodiment of setting the resistance states of a phase change element 106. Graph 250 includes the current in Amps (A) applied to the phase change element on x-axis 254 versus the resistance in Ohms of the phase change element on y-axis 252 after applying the specified current. Starting from a fully reset phase change element as indicated at 256, a current between approximately 0A and $0.3\times10^{-3}$A does not change the resistance state of the phase change element from the fully reset state. A current between approximately $0.3\times10^{-3}$A and $0.5\times10^{-3}$A changes the resistance state of the phase change element to a partially set state as indicated at 260. A current between approximately $0.5\times10^{-3}$A and $1.4\times10^{-3}$A changes the resistance state of the phase change element to a fully set state as indicated at 258. A current between approximately $1.4\times10^{-3}$A and $1.6\times10^{-3}$A changes the resistance state of the phase change element to a partially reset state as indicated at 262. A current greater than approximately $1.6\times10^{-3}$A changes the resistance state of the phase change element back to the fully reset state as indicated at 256. The specific current ranges for obtaining the partially set, fully set, partially reset, and fully reset states will vary based on the phase change material used, the memory cell concept used, and the memory cell dimensions used.

Starting from the fully reset state as indicated at 256, a phase change element 106 can be programmed to one of four resistance states by controlling the current. If no current is applied, the phase change element remains in the fully reset state. If a small current is applied, the phase change element is programmed to a first state as indicated at 264. This state is illustrated at 200a in FIG. 2. In one embodiment, this state is a "11" state. If additional current is applied beyond the first state, the phase change element is programmed to a second state as indicated at 266. This state is illustrated at 200b in FIG. 2. In one embodiment, this state is a "10" state. If additional current is applied beyond the second state, the phase change element is programmed to a third state as indicated at 268. This state is illustrated at 200c in FIG. 2. In one embodiment, this state is a "01" state. If additional current is applied beyond the third state, the phase change element is programmed to the fully set state as indicated at 270. This state is illustrated at 200d in FIG. 2. In one embodiment, this state is a "00" state.

Starting from the fully set state as indicated at 258, a phase change element can also be programmed to one of four resistance states by controlling the current. For example, if a first current is applied, the phase change element is programmed to a first state as indicated at 272. In one embodiment, this state is a "00" state. If additional current is applied beyond the first state, the phase change element is programmed to a second state as indicated at 274. In one embodiment, this state is a "01" state. If additional current is applied beyond the second state, the phase change element is programmed to a third state as indicated at 276. In one embodiment, this state is a "10" state. If additional current is applied beyond the third state, the phase change element is programmed to the fully reset state as indicated at 278. In one embodiment, this state is a "11" state.

Figure 4:
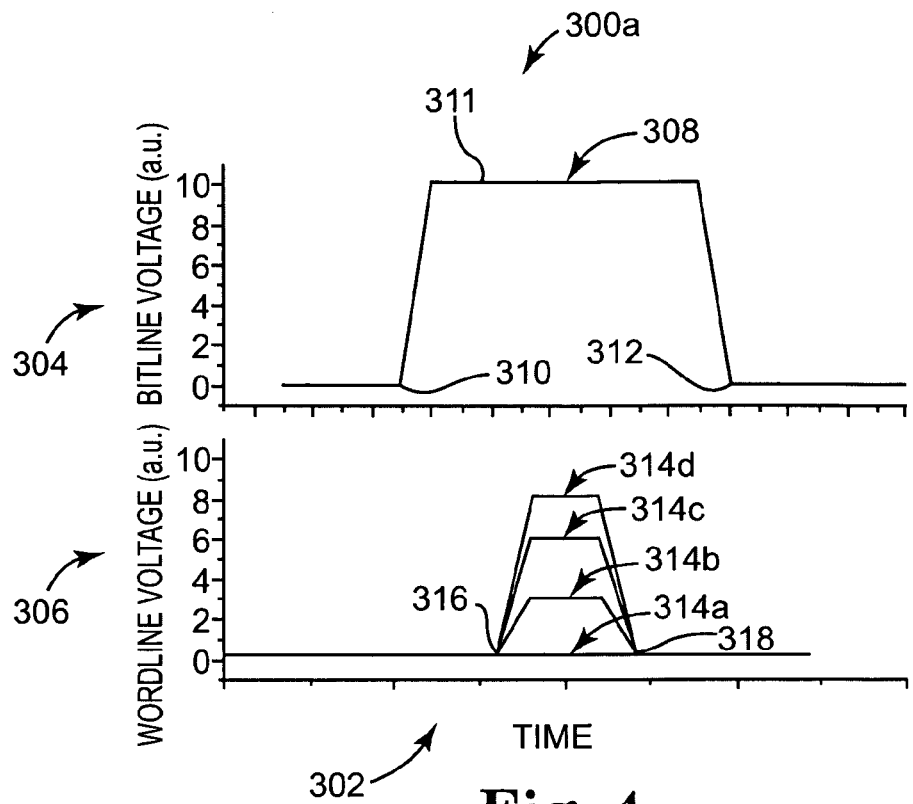
FIG. 4 is a timing diagram illustrating one embodiment of signals for programming a phase change memory cell.

FIG. 4 is a timing diagram 300a illustrating one embodiment of signals for programming a phase change memory cell 104. In this embodiment, the phase change element 106 begins in the fully reset (i.e., amorphous) state. Timing diagram 300a includes time on x-axis 302, bit line voltage on y-axis 304, and word line voltage on y-axis 306. To program a selected phase change element 106 to one of four resistance states, read/write circuit 103 precharges the bit line 112 coupled to the selected phase change element 106 as indicated by signal 308. Signal 308 increases from 0V at 310 to a fixed voltage at 311 and decreases back to 0V at 312. With the bit line precharged to the fixed voltage at 311, read/write circuit 103 provides a selected set voltage pulse on the word line 110 coupled to the gate of the transistor 108, which is coupled to the selected phase change element 106. Each set voltage pulse begins at 316 and ends at 318. Therefore, the selected set voltage pulse defines both the initiation and the termination of the current pulse applied to the selected phase change element 106.

To program the selected phase change element 106 to the "00" state, such as the state indicated at 200a in FIG. 2, read/write circuit 103 provides no set voltage pulse as indicated by signal 314a. To program the selected phase change element 106 to the "01" state, such as the state indicated at 200b in FIG. 2, read/write circuit 103 provides a set voltage pulse having a first amplitude as indicated by signal 314b. To program the selected phase change element 106 to the "10" state, such as the state indicated at 200c in FIG. 2, read/write circuit 103 provides a set voltage pulse having a second amplitude greater than the first amplitude as indicated by signal 314c. To program the selected phase change element 106 to the "11" state, such as the state indicated at 200d in FIG. 2, read/write circuit 103 provides a set voltage pulse having a third amplitude greater than the second amplitude as indicated by signal 314d.

Figure 5:
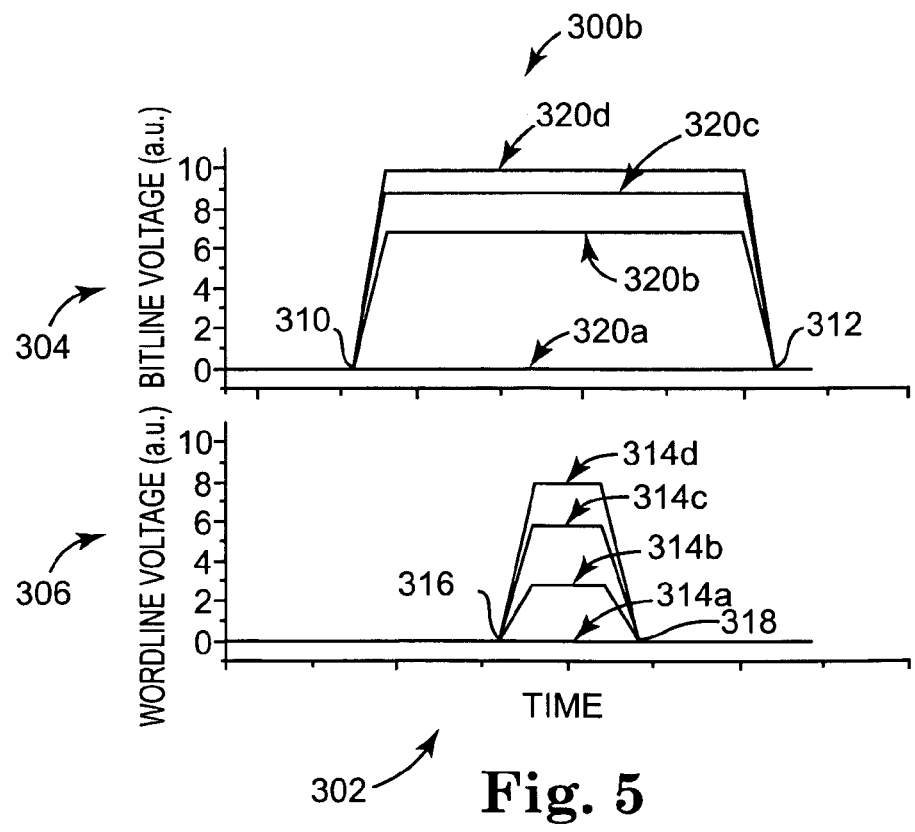
FIG. 5 is a timing diagram illustrating another embodiment of signals for programming a phase change memory cell.

FIG. 5 is a timing diagram 300b illustrating another embodiment of signals for programming a phase change memory cell 104. Timing diagram 300b is similar to timing diagram 300a previously described and illustrated with reference to FIG. 4, except that in timing diagram 300b the precharge voltage applied to the bit line 112 also varies based on the desired state of the phase change element 106.

To program the selected phase change element 106 to the "00" state, such as the state indicated at 200a in FIG. 2, read/write circuit 103 applies no precharge voltage to the bit line 112 as indicated by signal 320a in addition to providing no set voltage pulse on the word line 110 as indicated by signal 314a. To program the selected phase change element 106 to the "01" state, such as the state indicated at 200b in FIG. 2, read/write circuit 103 applies a first precharge voltage to the bit line 112 as indicated by signal 320b in addition to providing the set voltage pulse indicated by signal 314b. To program the selected phase change element 106 to the "10" state, such as the state indicated at 200c in FIG. 2, read/write circuit 103 applies a second precharge voltage greater than the first precharge voltage to the bit line 112 as indicated by signal 320c in addition to providing the set voltage pulse indicated by signal 314c. To program the selected phase change element 106 to the "11" state, such as the state indicated at 200d in FIG. 2, read/write circuit 103 applies a third precharge voltage greater than the second precharge voltage to the bit line 112 as indicated by signal 320d in addition to providing the set voltage pulse indicated by signal 314d.

Figure 6:
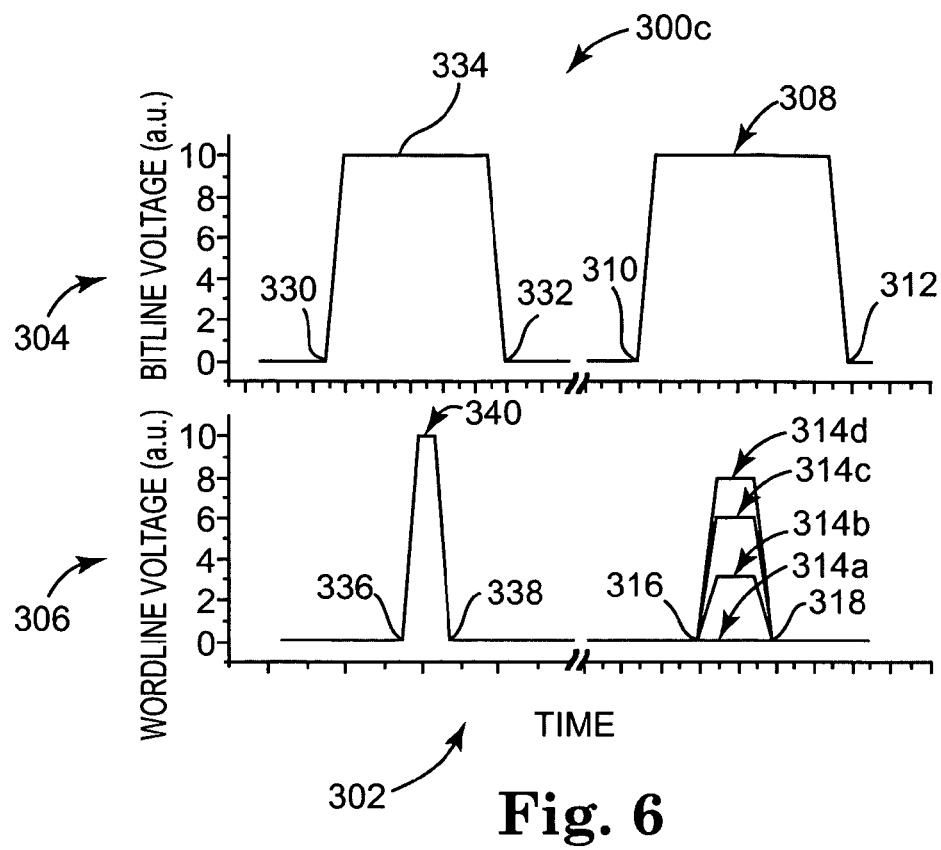
FIG. 6 is a timing diagram illustrating another embodiment of signals for programming a phase change memory cell.

FIG. 6 is a timing diagram 300c illustrating another embodiment of signals for programming a phase change memory cell 104. Timing diagram 300c is similar to timing diagram 300a previously described and illustrated with reference to FIG. 4, except that timing diagram 300c includes a reset operation. To program a selected phase change element 106 to one of four states, read/write circuit 103 first resets the selected phase change element 106. Read/write circuit 103 resets the selected phase change element 106 by precharging the bit line 112 as indicated by signal 308. Signal 308 increases from 0V at 330 to a fixed voltage at 334 and decreases back to 0V at 332. With the bit line 112 precharged to the fixed voltage at 334, read/write circuit 103 provides a voltage pulse on the word line 110 as indicated by signal 340. The voltage pulse begins at 336 and ends at 338. The amplitude of the reset voltage pulse indicated by signal 340 is greater than the amplitudes of the set pulses indicated by signals 314a-314d. The voltage pulse indicated by signal 340 resets the selected phase change element 106 such that one of the subsequent set voltage pulses indicated by signals 314a-314d programs the selected phase change element 106 to the desired state.

Figure 7:
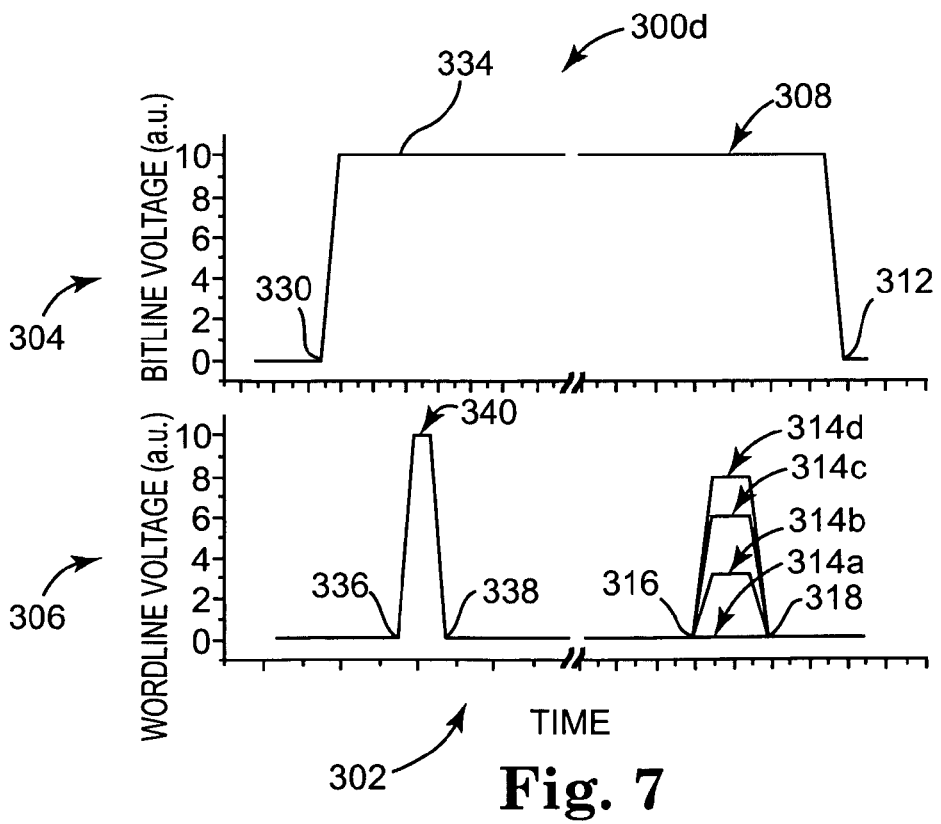
FIG. 7 is a timing diagram illustrating another embodiment of signals for programming a phase change memory cell.

FIG. 7 is a timing diagram 300d illustrating another embodiment of signals for programming a phase change memory cell 104. Timing diagram 300d is similar to timing diagram 300c previously described and illustrated with reference to FIG. 6, except that in timing diagram 300d the bit line precharge voltage remains applied to the bit line 112 between the reset voltage pulse 340 and the selected set voltage pulse 314a-314d. Signal 308 remains at the fixed precharge voltage indicated at 334 and thus the ramp down to 0V at 332 and the ramp up at 310, as illustrated in FIG. 6, are skipped.

Figure 8:
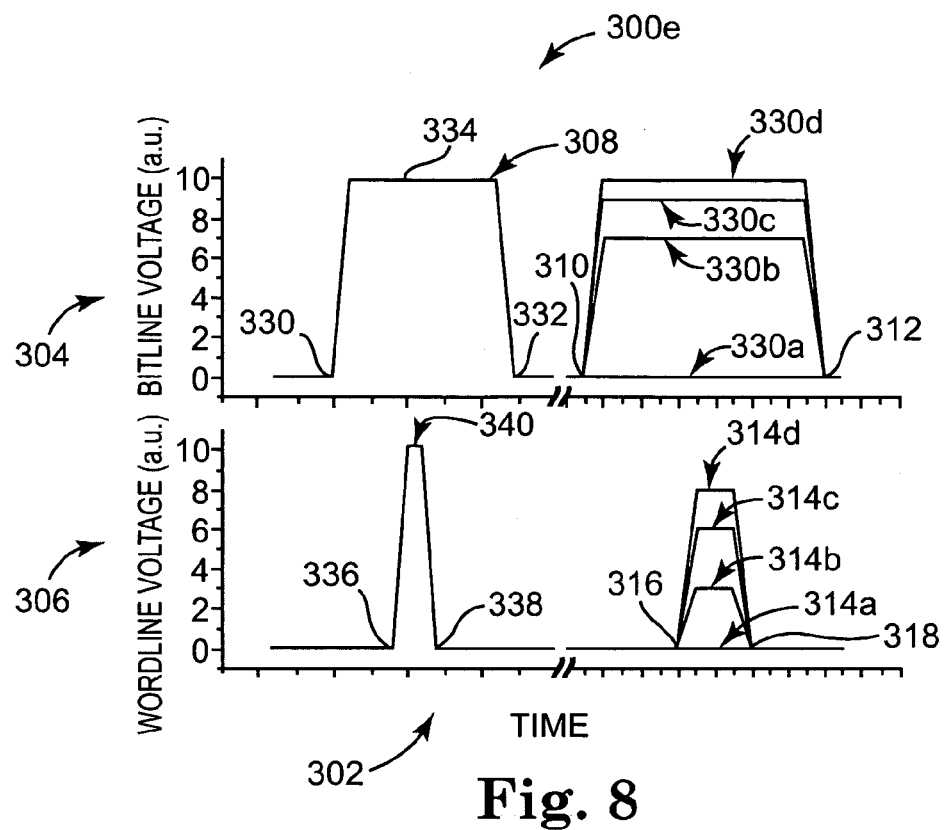
FIG. 8 is a timing diagram illustrating another embodiment of signals for programming a phase change memory cell.

FIG. 8 is a timing diagram 300e illustrating another embodiment of signals for programming a phase change memory cell 104. Timing diagram 300e is similar to timing diagram 300b previously described and illustrated with reference to FIG. 5, except that timing diagram 300e includes a reset operation. To program a selected phase change element 106 to one of four states, read/write circuit 103 first resets the selected phase change element 106. Read/write circuit 103 resets the selected phase change element 106 by precharging the bit line 112 as indicated by signal 308. Signal 308 increases from 0V at 330 to a fixed voltage at 334 and decreases back to 0V at 332. With the bit line 112 precharged to the fixed voltage at 334, read/write circuit 103 provides a voltage pulse on the word line 110 as indicated by signal 340. The voltage pulse begins at 336 and ends at 338. The amplitude of the reset voltage pulse indicated by signal 340 is greater than the amplitudes of the set pulses indicated by signals 314a-314d. The voltage pulse indicated by signal 340 resets the selected phase change element 106 such that one of the subsequent set voltage pulses 314a-314d programs the selected phase change element 106 to the desired state.

Figure 9:
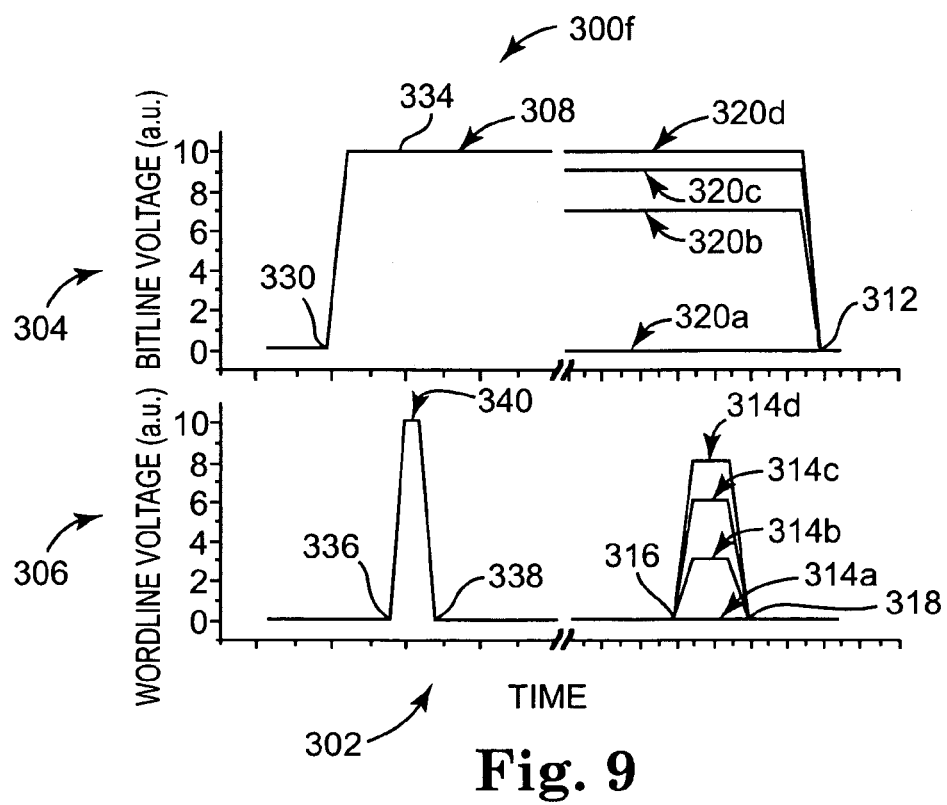
FIG. 9 is a timing diagram illustrating another embodiment of signals for programming a phase change memory cell.

FIG. 9 is a timing diagram 300f illustrating another embodiment of signals for programming a phase change memory cell 104. Timing diagram 300f is similar to timing diagram 300e previously described and illustrated with reference to FIG. 8, except that in timing diagram 300f the bit line precharge voltage remains applied to the bit line 112 between the reset voltage pulse 340 and the selected set voltage pulse 314a-314d. Signal 308 remains at the fixed precharge voltage indicated at 334 before transitioning to one of the selected precharge voltages indicated at 320a-320d and thus the ramp down to 0V at 332 and the ramp up at 310, as illustrated in FIG. 8, are skipped.

Figure 10:
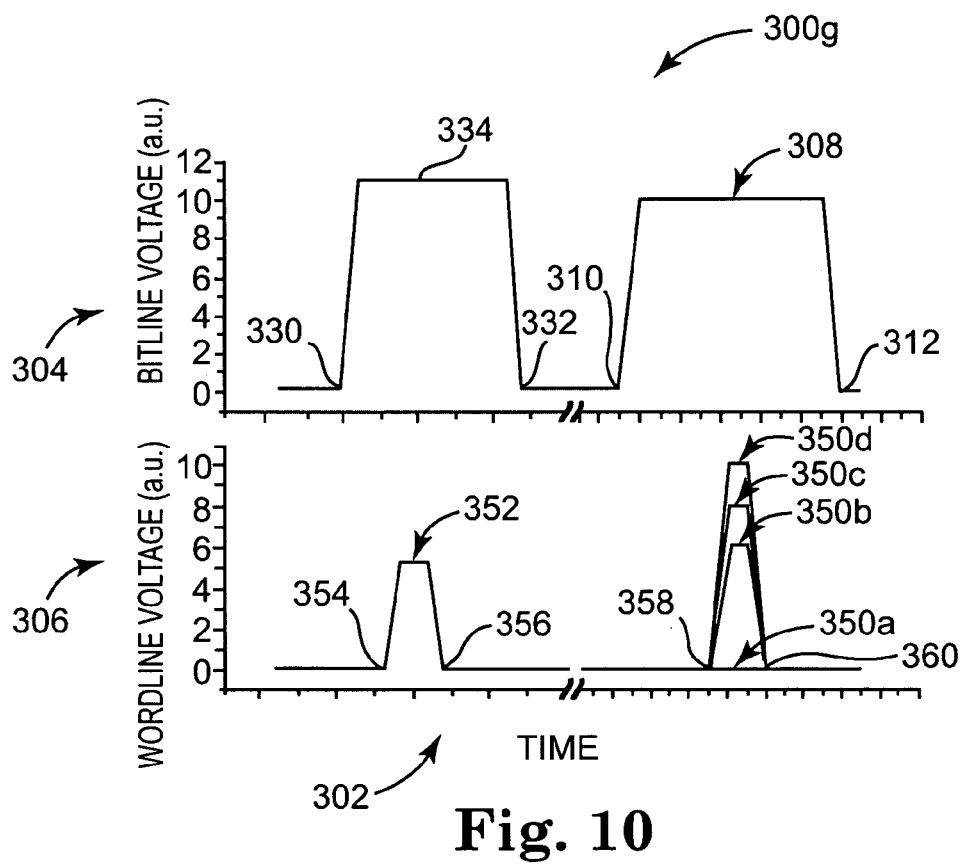
FIG. 10 is a timing diagram illustrating another embodiment of signals for programming a phase change memory cell.

FIG. 10 is a timing diagram 300g illustrating another embodiment of signals for programming a phase change memory cell 104. In this embodiment, a selected phase change element 106 is first programmed to a fully set (i.e., crystalline) state and then reset to the desired state. To program a selected phase change element 106 to one of four resistance states, read/write circuit 103 precharges the bit line 112 coupled to the selected phase change element 106 as indicated by signal 308. Signal 308 increases from 0V at 330 to a fixed voltage at 334 and decreases back to 0V at 332. With the bit line 112 precharged to the fixed voltage at 334, read/write circuit 103 provides a set voltage pulse 352 on the word line 110 coupled to the gate of the transistor 108, which is coupled to the selected phase change element 106. The set voltage pulse 352 begins at 354 and ends at 356.

With the selected phase change element 106 in the set state, read/write circuit 103 again precharges bit line 112 as indicated by signal 308. Signal 308 increases from 0V at 310 to a fixed voltage at 311 and decreases back to 0V at 312. With the bit line precharged to the fixed voltage at 311, read/write circuit 103 provides a selected reset voltage pulse on the word line 110. Each reset voltage pulse begins at 358 and ends at 360. Therefore, the selected reset voltage pulse defines both the initiation and the termination of the current pulse applied to the selected phase change element 106.

To program the selected phase change element 106 to the "00" state, read/write circuit 103 provides no reset voltage pulse as indicated by signal 350a. To program the selected phase change element 106 to the "01" state, read/write circuit 103 provides a reset voltage pulse having a first amplitude as indicated by signal 350b. To program the selected phase change element 106 to the "10" state, read/write circuit 103 provides a reset voltage pulse having a second amplitude greater than the first amplitude as indicated by signal 350c. To program the selected phase change element 106 to the "11" state, read/write circuit 103 provides a reset voltage pulse having a third amplitude greater than the second amplitude as indicated by signal 350d. The amplitude of the set voltage pulse indicated by signal 352 is less than the amplitudes of the reset pulses indicated by signals 350b-350d. The voltage pulse indicated by signal 352 sets the selected phase change element 106 such that one of the subsequent reset voltage pulses 350a-350d program the selected phase change element 106 to the desired state.

Figure 11:
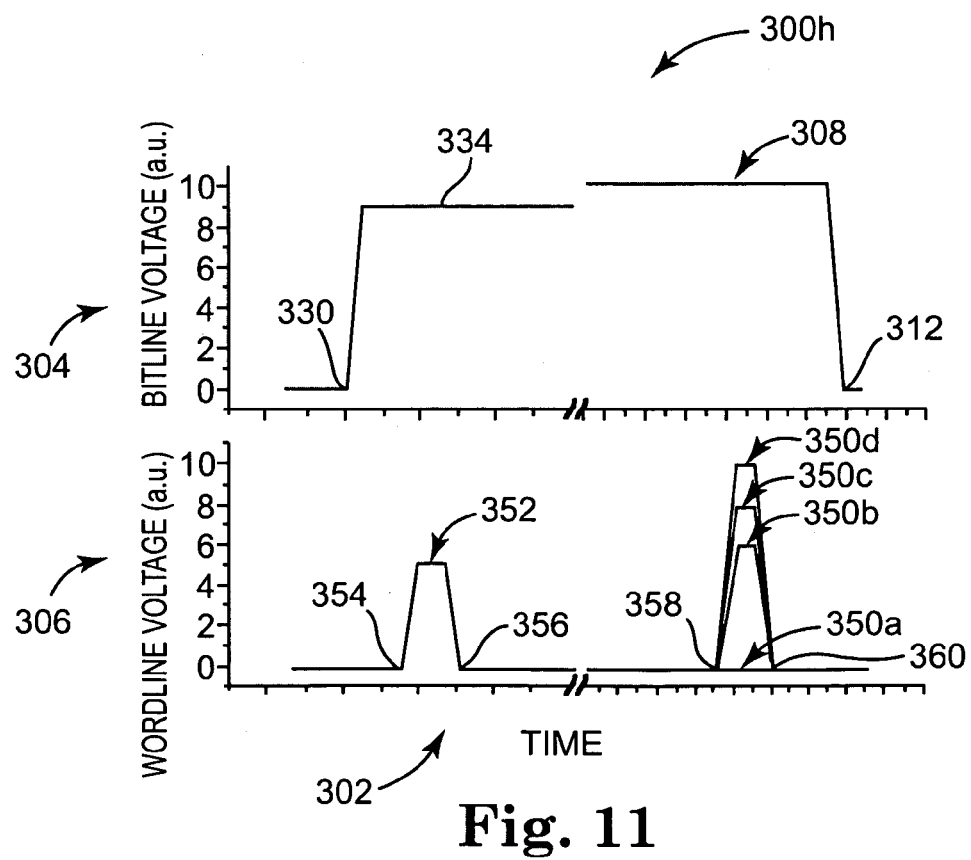
FIG. 11 is a timing diagram illustrating another embodiment of signals for programming a phase change memory cell.

FIG. 11 is a timing diagram 300h illustrating another embodiment of signals for programming a phase change memory cell 104. Timing diagram 300h is similar to timing diagram 300g previously described and illustrated with reference to FIG. 10, except that in timing diagram 300h the bit line precharge voltage remains applied to the bit line 112 between the set voltage pulse 352 and the selected reset voltage pulse 350a-350d. Signal 308 transitions from the fixed precharge voltage indicated at 334 to the fixed precharge voltage indicated at 311 and thus the ramp down to 0V at 332 and the ramp up at 310, as illustrated in FIG. 10, are skipped.

Figure 12:
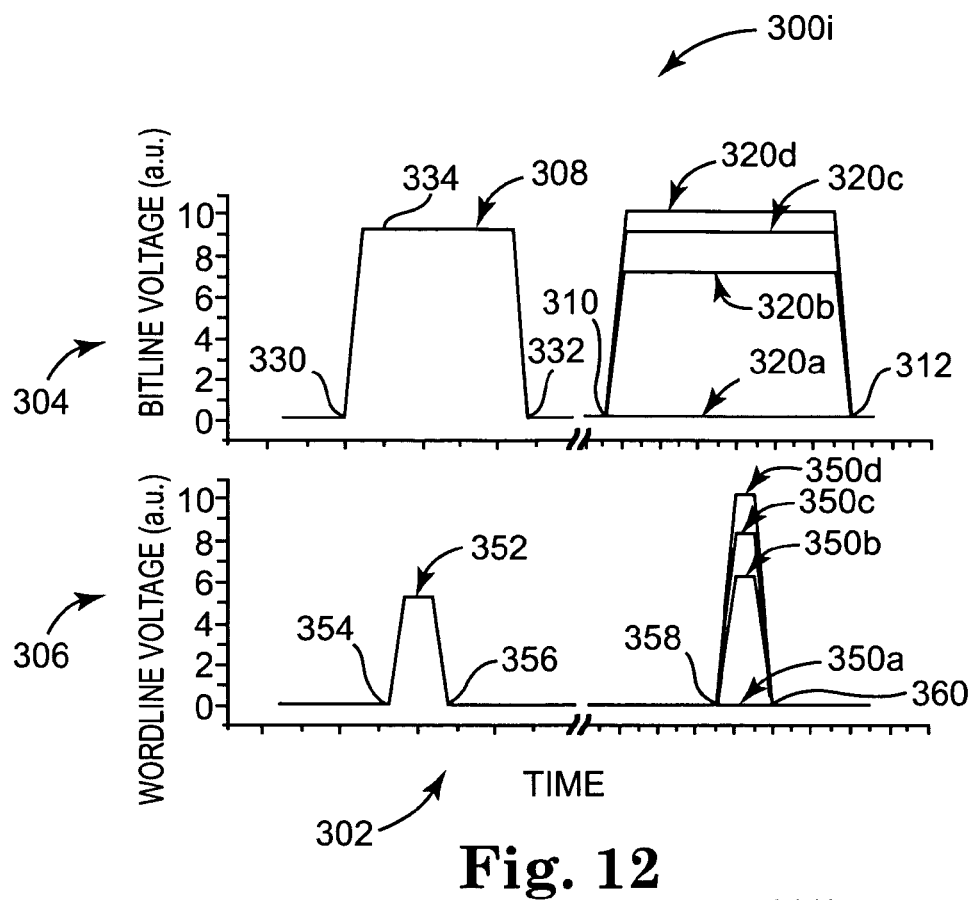
FIG. 12 is a timing diagram illustrating another embodiment of signals for programming a phase change memory cell.

FIG. 12 is a timing diagram 300*i* illustrating another embodiment of signals for programming a phase change memory cell 104. Timing diagram 300*i* is similar to timing diagram 300*g* previously described and illustrated with reference to FIG. 10, except that in timing diagram 300*i* the precharge voltage applied to the bit line 112 for the selected reset voltage pulse also varies based on the desired state of the phase change element 106.

To program the selected phase change element 106 to the "00" state, read/write circuit 103 applies no precharge voltage to the bit line 112 as indicated by signal 320*a* in addition to providing no reset voltage pulse on the word line 110 as indicated by signal 350*a*. To program the selected phase change element 106 to the "01" state, read/write circuit 103 applies a first precharge voltage to the bit line 112 as indicated by signal 320*b* in addition to providing the reset voltage pulse indicated by signal 350*b*. To program the selected phase change element 106 to the "10" state, read/write circuit 103 applies a second precharge voltage greater than the first precharge voltage to the bit line 112 as indicated by signal 320*c* in addition to providing the reset voltage pulse indicated by signal 350*c*. To program the selected phase change element 106 to the "11" state, read/write circuit 103 applies a third precharge voltage greater than the second precharge voltage to the bit line 112 as indicated by signal 320*d* in addition to providing the reset voltage pulse indicated by signal 350*d*.

Figure 13:
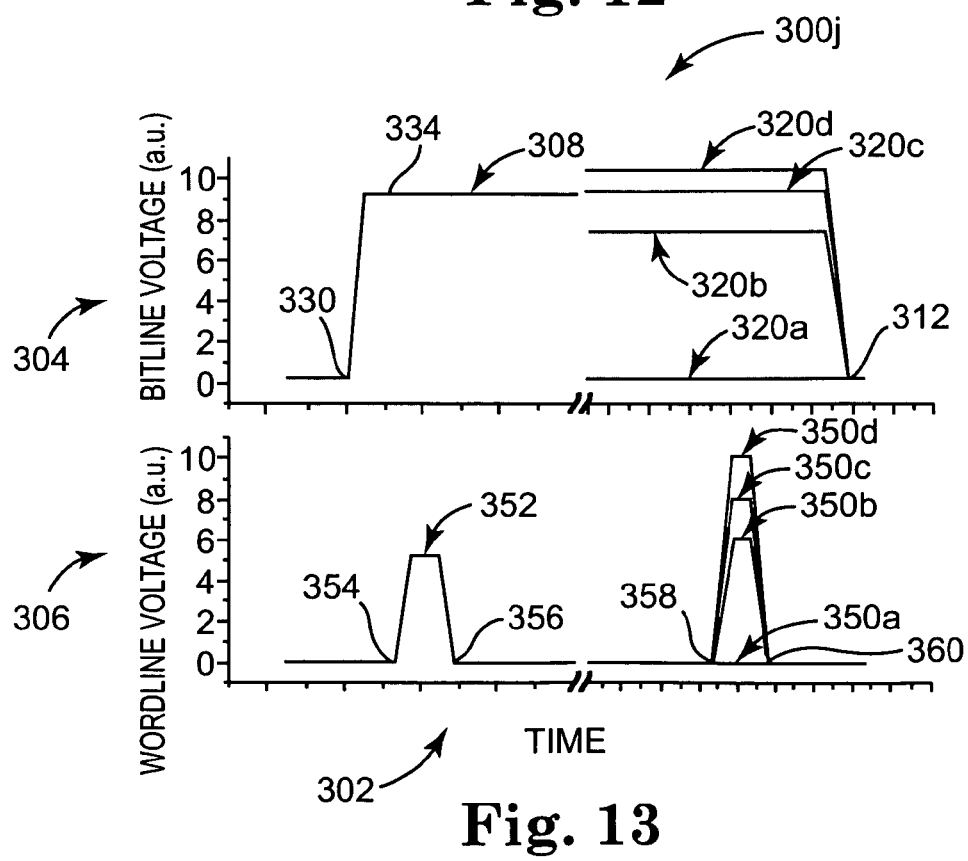
FIG. 13 is a timing diagram illustrating another embodiment of signals for programming a phase change memory cell.

FIG. 13 is a timing diagram 300*j* illustrating another embodiment of signals for programming a phase change memory cell 104. Timing diagram 300*j* is similar to timing diagram 300*i* previously described and illustrated with reference to FIG. 12, except that in timing diagram 300*j* the bit line precharge voltage remains applied to the bit line 112 between the set voltage pulse 352 and the selected reset voltage pulse 350*a*-350*d*. Signal 308 remains at the fixed precharge voltage indicated at 334 before transitioning to one of the selected precharge voltages indicated at 320*a*-320*d* and thus the ramp down to 0V at 332 and the ramp up at 310, as illustrated in FIG. 12, are skipped.

Figure 14:
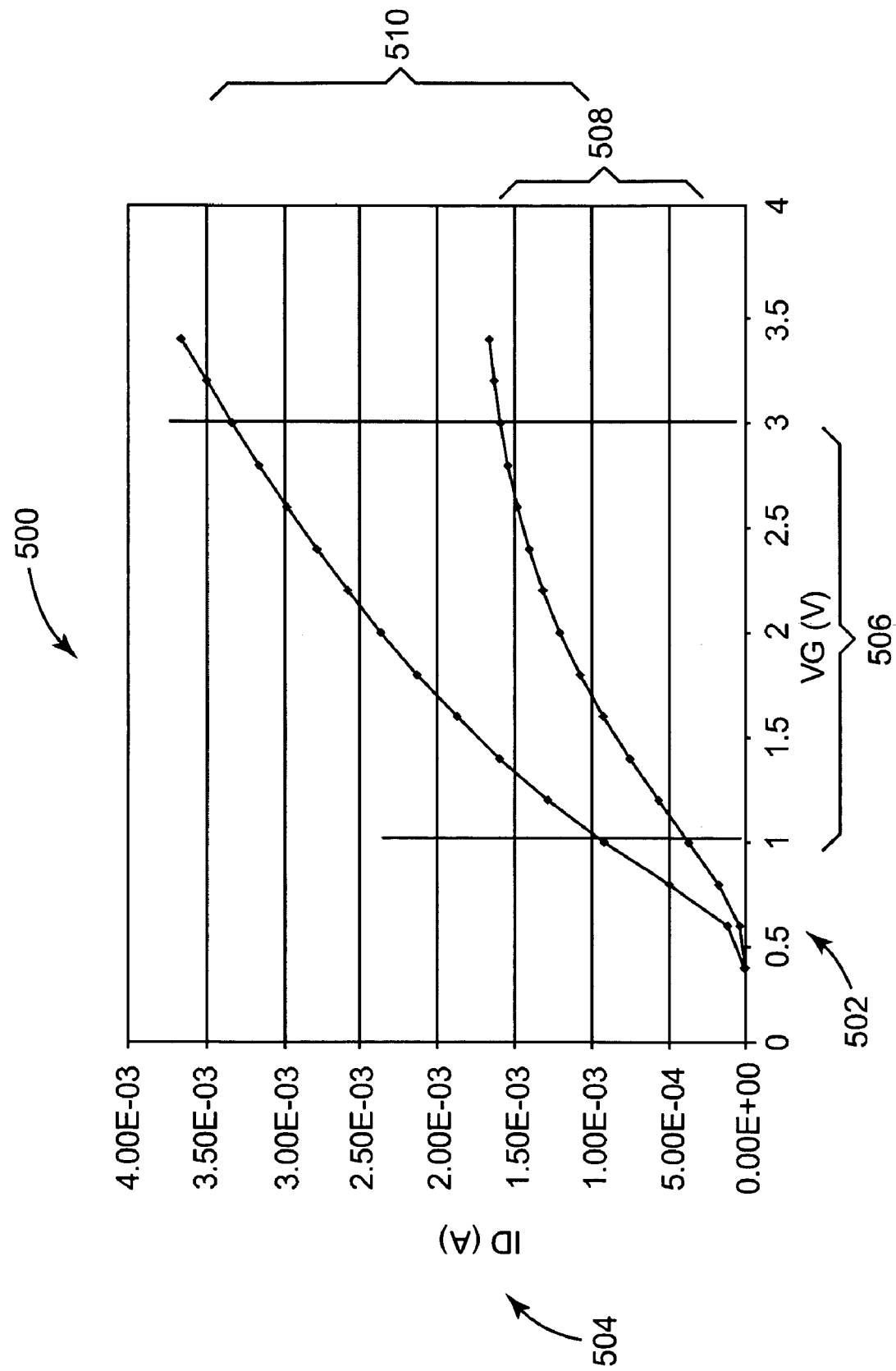
FIG. 14 is a graph illustrating one embodiment of gate voltage versus drain current for high and low bit line precharge voltage ranges.

FIG. 14 is a graph 500 illustrating one embodiment of gate voltage versus drain current for high and low bit line precharge voltage ranges. Graph 500 includes gate voltage (VG) in Volts (V) on x-axis 502 and drain current (ID) in Amps (A) on y-axis 504. Higher bit line 112 precharge voltages for higher current ranges are indicated at 510, and lower bit line 112 precharge voltages for lower current ranges are indicated at 508. One embodiment of a word line 110 voltage range is indicated at 506. Curve 512 illustrates gate voltage versus drain current for a first bit line 112 precharge voltage, and curve 514 illustrates gate voltage versus drain current for a second bit line 112 precharge voltage. The second bit line 112 precharge voltage is greater than the first bit line 112 precharge voltage. The lower bit line 112 precharge voltage indicated at 508 provides better control for low amplitude current pulses as compared to the higher bit line 112 precharge voltage indicated at 510.

Figure 15:
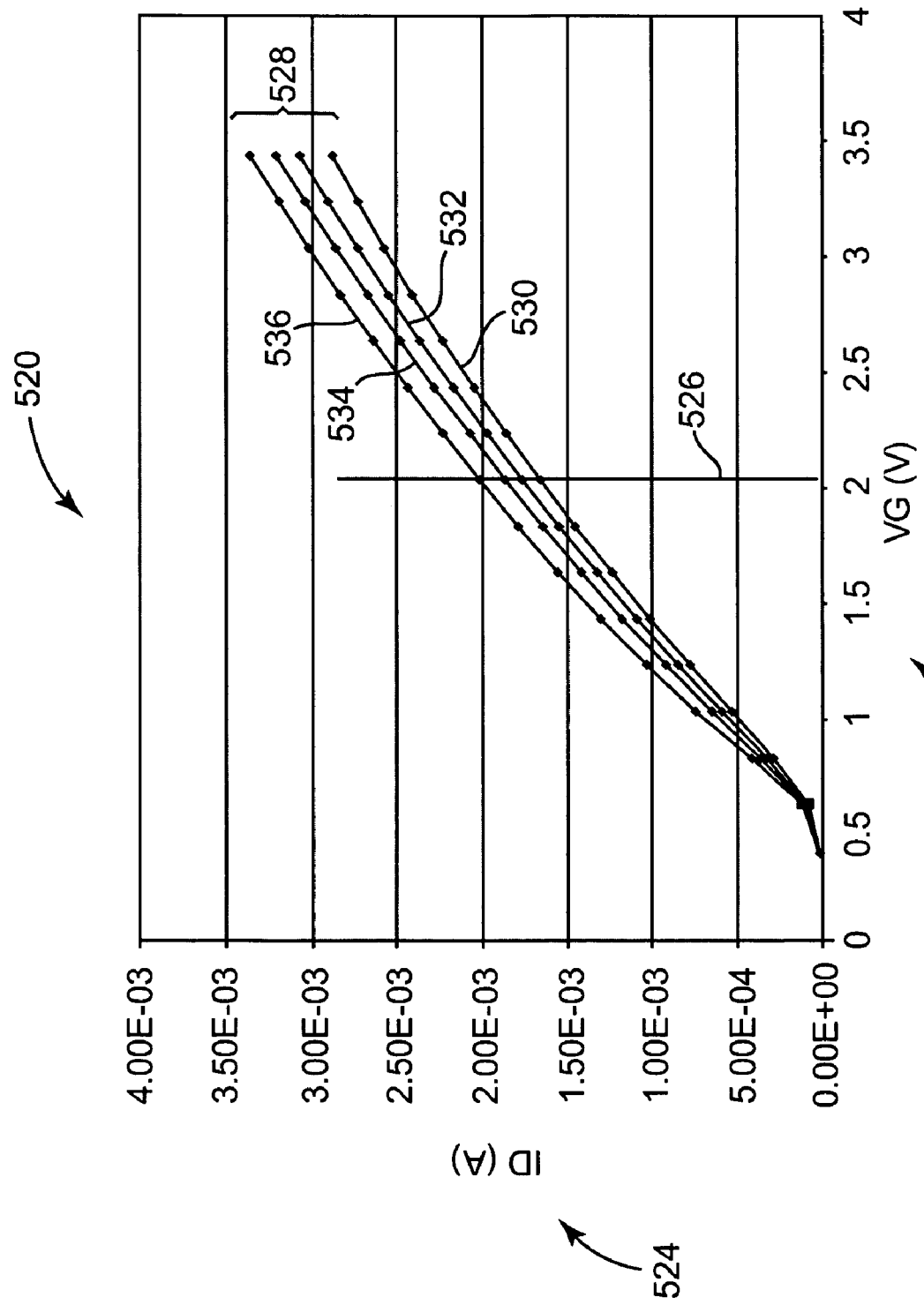
FIG. 15 is a graph illustrating one embodiment of gate voltage versus drain current for varying effective source to drain voltages.

FIG. 15 is a graph 520 illustrating one embodiment of gate voltage versus drain current for varying effective source to drain voltages. Graph 520 includes gate voltage (VG) in Volts (V) on x-axis 522 and drain current (ID) in Amps (A) on y-axis 524. Curve 530 illustrates gate voltage versus drain current for a drain voltage of 1.5V. Curve 532 illustrates gate voltage versus drain current for a drain voltage of 2V. Curve 534 illustrates gate voltage versus drain current for a drain voltage of 2.5V, and curve 536 illustrates gate voltage versus drain current for a drain voltage of 3V. As indicated at 528, the dependence of the drain current on the source to drain voltage is small. At a typical gate voltage for programming one state to a phase change element, as indicated at 526, the variation in programming current is insignificant.

Figure 16:
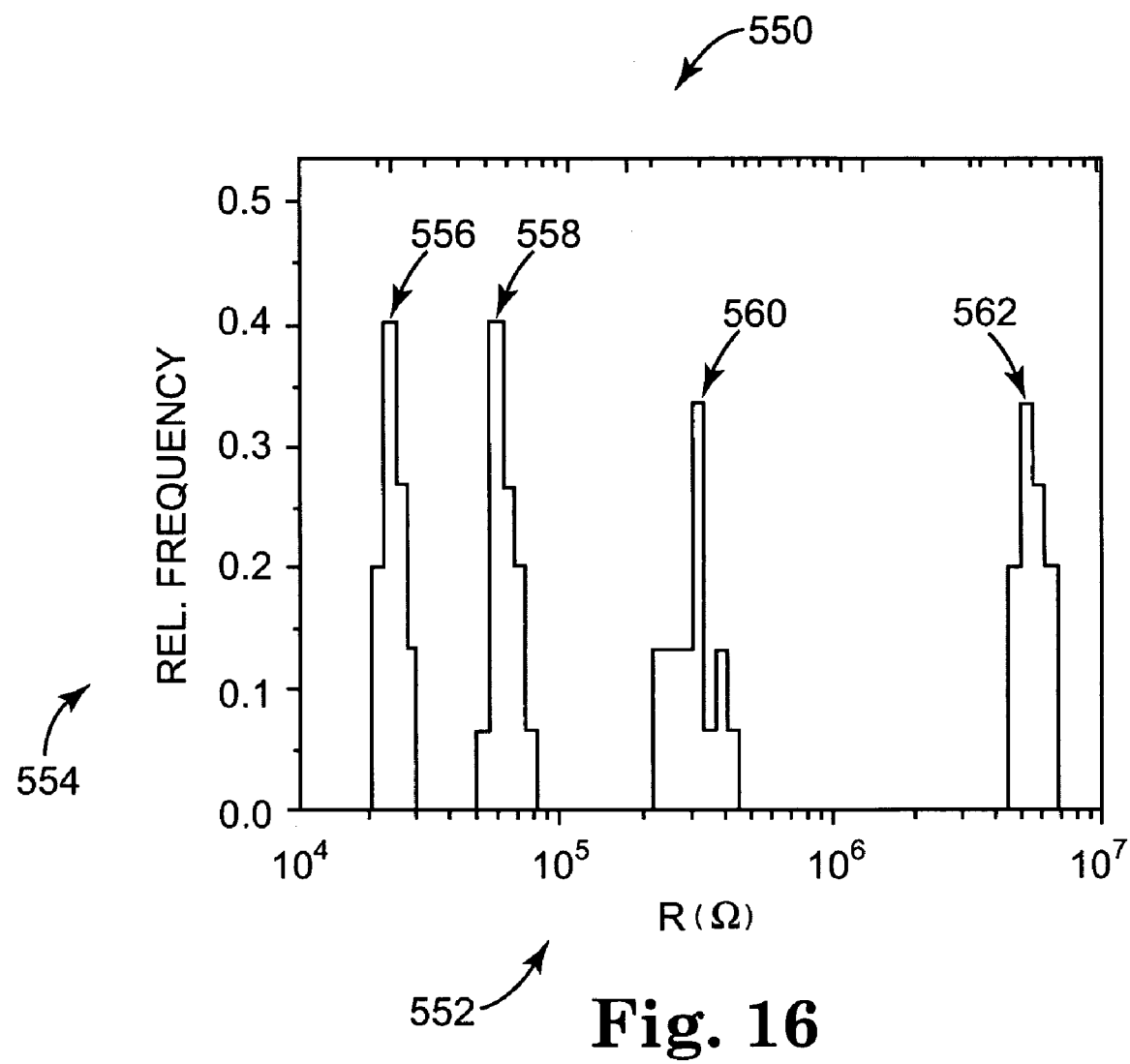
FIG. 16 is a chart illustrating one embodiment of the resistance distribution of a phase change element programmed from the reset state into one of four different resistance states.

FIG. 16 is a chart 550 illustrating one embodiment of the resistance distribution of a phase change element 106 programmed from the reset state into one of four different resistance states. Chart 550 includes resistance (R) in Ohms (Ω) on x-axis 552 and relative frequency on y-axis 554. In this embodiment, a single 300 ns set pulse is applied to the word line 110 with the bit line 112 precharged to program the selected phase change element 106 to the selected state. The distribution of resistance values for a phase change element 106 programmed to a "00" state, such as state 200*a* illustrated in FIG. 2, is indicated at 556. The distribution of resistance values for a phase change element 106 programmed to a "01" state, such as state 200*b* illustrated in FIG. 2, is indicated at 558. The distribution of resistance values for a phase change element 106 programmed to a "10" state, such as state 200*c* illustrated in FIG. 2, is indicated at 560, and the distribution of resistance values for a phase change element 106 programmed to a "11" state, such as state 200*d* illustrated in FIG. 2, is indicated at 562. The distributions are narrow and separated from each other, such that four distinct resistance levels are reliably achieved.

Figure 17:
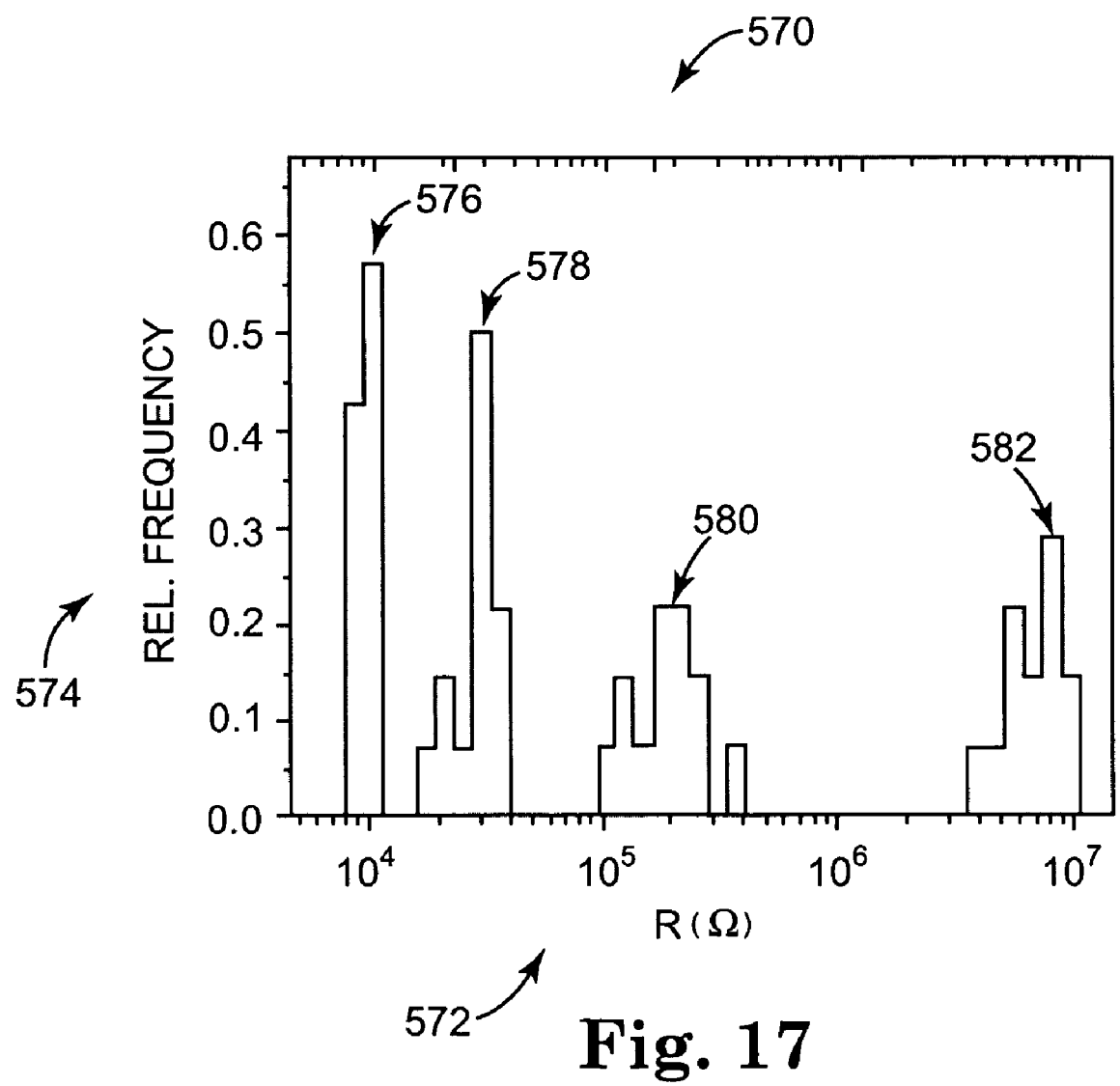
FIG. 17 is a chart illustrating one embodiment of the resistance distribution of a phase change element programmed from the set state into one of four different resistance states.

FIG. 17 is a chart illustrating one embodiment of the resistance distribution of a phase change element 106 programmed from the set state into one of four different resistance states. Chart 570 includes resistance (R) in Ohms (Ω) on x-axis 572 and relative frequency on y-axis 574. In this embodiment, a single 65 ns reset pulse is applied to the word line 110 with the bit line 112 precharged to program the selected phase change element 106 to the selected state. The distribution of resistance values for a phase change element 106 programmed to a "00" state is indicated at 576. The distribution of resistance values for a phase change element 106 programmed to a "01" state is indicated at 578. The distribution of resistance values for a phase change element 106 programmed to a "10" state is indicated at 580, and the distribution of resistance values for a phase change element 106 programmed to a "11" state is indicated at 582. The distributions are narrow and separated from each other, such that four distinct resistance levels are reliably achieved.

Embodiments of the present invention provide a method for programming a phase change memory cell to a selected one of more than two resistance states. The memory cells are programmed by first precharging the bit line coupled to the selected memory cell and then by applying a voltage pulse to a word line coupled to the gate of a transistor, which is coupled to the selected memory cell. The precharge voltage on the bit line and the voltage pulse on the word line form a current pulse through the selected memory cell using the transistor. The current pulse programs the selected memory cell to the desired state. By controlling the amplitude of the voltage pulse applied to the word line and/or by controlling the precharge voltage applied to the bit line, the memory cell is set to the desired state.

In this way, the power delivered to the phase change element is precisely controlled. In addition, no potentially large current source circuits are used, since voltage pulses are applied to the memory cells. Further, the pulse timing is not impacted by the resistance-capacitance (R-C) delays of the bit line system. In addition, the impedance of a word line is independent of the states of the individual phase change memory cells coupled to that word line. Therefore, more reproducible and more uniform pulses can be obtained for programming the phase change elements as compared to typical programming methods.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory comprising:
a resistivity changing element having a first side and a second side;
a bit line coupled to the first side of the element;
an access device coupled to the second side of the element;
a word line coupled to the access device for controlling the access device; and
a circuit to program the element to a selected one of three or more states, the circuit adapted
to precharge the bit line to a first bit line precharge voltage having a first bit line precharge voltage amplitude and then to apply a voltage pulse having a first word line voltage amplitude to the word line if the element is to be programmed to a first selected state, and
to precharge the bit line to a second bit line precharge voltage having a second bit line precharge voltage amplitude and then to apply a voltage pulse having a second word line voltage amplitude to the word line if the element is to be programmed to a second selected state,
wherein the first bit line precharge voltage amplitude is smaller than the second bit line precharge voltage amplitude.

2. The integrated circuit of claim 1, wherein the access device comprises a transistor.

3. The integrated circuit of claim 2, wherein the transistor comprises a bipolar transistor.

4. The integrated circuit of claim 1, wherein the voltage pulse comprises a set voltage pulse.

5. The integrated circuit of claim 1, wherein the voltage pulse comprises a reset voltage pulse.

6. A memory comprising:
a phase change element;
a bit line coupled to one side of the element;
a transistor having a source-drain path, one side of the source-drain path coupled to another side of the element;
a word line coupled to a gate of the transistor; and
a circuit to program the element to a selected one of three or more states, the circuit configured
to precharge the bit line to a first bit line precharge voltage having a first bit line precharge amplitude and then to apply a voltage pulse having a first word line voltage amplitude to the word line if the element is to be programmed to a first selected state, and
to precharge the bit line to a second bit line precharge voltage having a second bit line precharge voltage amplitude and then to apply a voltage pulse having a second word line voltage amplitude to the word line if the element is to be programmed to a second selected state,
wherein the first bit line precharge voltage amplitude is smaller than the second bit line precharge voltage amplitude.

7. The memory of claim 6, wherein the voltage pulse comprises a set voltage pulse.

8. The memory of claim 6, wherein the voltage pulse comprises a reset voltage pulse.

9. A memory comprising:
a phase change element;
a bit line coupled to one side of the element;
an access device coupled to another side of the element;
a word line coupled to the access device for controlling the access device; and
means for programming the element to a selected one of three or more states, the means including:
means for precharging the bit line to a first bit line precharge voltage having a first bit line precharge voltage amplitude and then for applying a voltage pulse having a first word line voltage amplitude to the word line if the element is to be programmed to a first selected state, and
means for precharging the bit line to a second bit line precharge voltage having a second bit line precharge voltage amplitude and then for applying a voltage pulse having a second word line voltage amplitude to the word line if the element is to be programmed to a second selected state,
wherein the first bit line precharge voltage amplitude is smaller than the second bit line precharge voltage amplitude.

10. The memory of claim 9, wherein the means for applying the voltage pulse comprises means for applying a set voltage pulse.

11. The memory of claim 9, wherein the means for applying the voltage pulse comprises means for applying a reset voltage pulse.

12. A method for programming a memory cell to a selected one of three or more states, the method comprising:
precharging a bit line coupled to one side of the phase change element to a first bit line precharge voltage having a first bit line precharge voltage amplitude and then applying a voltage pulse having a first word line voltage amplitude to a word line coupled to an access device for controlling the access device if the element is to be programmed to a first selected state; and
precharging the bit line to a second bit line precharge voltage having a second bit line precharge voltage amplitude and then applying a voltage pulse having a second word line voltage amplitude to the word line if the element is to be programmed to a second selected state,
where in the first bit line precharge voltage amplitude is smaller than the second bit line precharge voltage amplitude.

13. The method of claim 12, wherein applying the voltage pulse comprises applying a set voltage pulse.

14. The method of claim 12, wherein applying the voltage pulse comprises applying a reset voltage pulse.

15. A method for programming a phase change element to a selected one of three or more states, the method comprising:
applying a first bit line precharge voltage having a first bit line precharge amplitude to a bit line coupled to the phase change element;
setting the phase change element to an initial state by applying a first voltage pulse having a first word line voltage amplitude to a word line of a transistor coupled to the element;
setting the phase change element to the selected state by applying a second voltage pulse having a second word line voltage amplitude if the element is to be programmed to a first selected state; and setting the phase change element to the selected state by applying a second voltage pulse having a third word line voltage amplitude if the element is to be programmed to a second selected state, wherein the first, second, and third word line voltage amplitudes are different.

16. The method of claim 15, wherein setting the phase change element to the initial state comprises applying a reset voltage pulse, and wherein setting the phase change element to the selected state comprises applying a set voltage pulse.

17. The method of claim 15, wherein setting the phase change element to the initial state comprises applying a set voltage pulse, and wherein setting the phase change element to the selected state comprises applying a reset voltage pulse.

18. The method of claim 15, further comprising:
removing the first bit line precharge voltage from the bit line after setting the phase change element to the initial state; and
applying a second bit line precharge voltage having a second bit line precharge amplitude to the bit line before setting the phase change element to the selected state.

19. The method of claim 18, wherein applying the second bit line precharge voltage comprises applying a second bit line precharge voltage based on the selected state.

20. The method of claim 15, further comprising:
applying a second bit line precharge voltage having a second bit line precharge amplitude to the bit line before setting the phase change element to the selected state.

21. The method of claim 20, wherein applying the second bit line precharge voltage comprises applying a second bit line precharge voltage based on the selected state.

22. A memory comprising:
a phase change element having a first side and a second side;
one of a common and a ground coupled to the first side of the element;
an access device coupled to the second side of the element and a bit line;
a word line coupled to the access device for controlling the access device; and
a circuit to program the element to a selected one of three or more states, the circuit configured
to precharge the bit line to a first bit line precharge voltage having a first bit line precharge amplitude and then to apply a voltage pulse having a first word line voltage amplitude to the word line if the element is to be programmed to a first selected state, and
to precharge the bit line to a second bit line precharge voltage having a second bit line precharge voltage amplitude and then to apply a voltage pulse having a second word line voltage amplitude to the word line if the element is to be programmed to a second selected state,
wherein the first bit line precharge voltage amplitude is smaller than the second bit line precharge voltage amplitude.

\* \* \* \* \*